(12) United States Patent
Lee

(10) Patent No.: US 6,496,445 B2
(45) Date of Patent: Dec. 17, 2002

(54) SEMICONDUCTOR MEMORY DEVICE HAVING ALTERED CLOCK FREQUENCY FOR ADDRESS AND/OR COMMAND SIGNALS, AND MEMORY MODULE AND SYSTEM HAVING THE SAME

(75) Inventor: Dong-yang Lee, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/946,166

(22) Filed: Sep. 5, 2001

(65) Prior Publication Data

US 2002/0039324 A1 Apr. 4, 2002

(30) Foreign Application Priority Data

Sep. 5, 2000 (KR) .......................................... 2000-52377
Dec. 20, 2000 (KR) .......................................... 2000-79186

(51) Int. Cl.[7] ................................................ G11C 8/00
(52) U.S. Cl. .............. 365/233; 365/189.05; 365/230.08
(58) Field of Search ........................... 365/233, 189.05, 365/230.08, 194, 189.12, 240

(56) References Cited

U.S. PATENT DOCUMENTS

| 5,892,730 | A |   | 4/1999 | Sato et al. |
| 6,052,329 | A |   | 4/2000 | Nishino et al. |
| 6,108,243 | A |   | 4/2000 | Suzuki et al. |
| 6,108,244 | A |   | 4/2000 | Lee et al. |
| 6,064,627 | A | * | 5/2000 | Sakurai ................. 365/189.05 |

* cited by examiner

Primary Examiner—David Lam
(74) Attorney, Agent, or Firm—Volentine Francos, PLLC

(57) ABSTRACT

A semiconductor memory device includes a clock buffer which receives an external clock signal and generates a first internal clock signal having a frequency lower than that of the external clock signal and a second internal clock signal having a frequency which is the same as that of the external clock signal. An address buffer, command signal buffer and/or register receive respective input signals at a timing of the first internal clock signal. On the other hand, a data buffer inputs/outputs data at a timing of the second internal clock signal.

44 Claims, 12 Drawing Sheets

SEMICONDUCTOR MEMORY DEVICE HAVING ALTERED CLOCK FREQUENCY FOR ADDRESS AND/OR COMMAND SIGNALS, AND MEMORY MODULE AND SYSTEM HAVING THE SAME

BACKGROUND OF THE INVENTION

1. Field of the Invention

The present invention relates to a memory device and to a memory module and system, and more particularly, the present invention relates to a semiconductor memory device which generates internal clock signals and to a memory module and system having the same.

2. Description of the Related Art

The increasing demand for computer systems capable of processing large amounts of data at high speeds has resulted in the continued development of highly efficient microcontrollers or central processing units (CPUs) which tend to operate at higher and higher system clock frequencies. The use of higher system clock frequencies requires, among other things, an increase in the data capacity and transmission speed of a data memory interfacing with the CPU. In other words, the memory must be configured to operate in synchronization with higher-frequency system clock signals.

FIG. 1 is a diagram illustrating a memory controller 110 and a memory module 120 of a CPU system board 100. The memory controller 110 transfers a clock signal CLK, an address signal ADDR, a command signal CMD and data DATA to the memory module 120 through a CLOCK BUS line, an ADDRESS BUS line, a COMMAND BUS line and a DATA BUS, respectively. The memory module 120 includes a plurality of memory chips (e.g., 8 memory chips) 101, 102, . . . , 108 embedded therein, each of which is connected to the CLOCK BUS line, the ADDRESS BUS line, the COMMAND BUS line and the DATA BUS as shown.

The clock signal CLK is supplied to the memory chips 101, 102, . . . , 108 to control the operation thereof. Also, in the case where the memory chips 101, 102, . . . , 108 are synchronous DRAM chips, the command signal CMD, the address signal ADDR and the data DATA are synchronized with edges of the clock signal CLK.

As shown in FIG. 1, the data DATA is input to/output from the memory chips 101, 102, . . . , 108 via the DATA BUS through independent multi-bit data lines connected to the respective memory chips 101, 102, . . . , 108. Thus, the load of each data line is one memory chip. On the contrary, the address signal ADDR and the command signal CMD are commonly supplied to the memory chips 101, 102, . . . , 108. As such, the ADDRESS BUS and COMMAND BUS lines are each subjected to the combined load of all of the memory chips 101, 102, . . . , 108.

As suggested previously, high speed CPUs are attended by high frequency clock signals CLK. Generally, the data DATA of the DATA BUS may be operated at such high frequencies since the load of each data line is relatively small (one memory chip). On the other hand, relatively high multi-memory chip loads of the ADDRESS BUS and COMMAND BUS lines can prevent high frequency operation of these lines. The loads of the ADDRESS BUS and COMMAND BUS lines can therefore limit the effective operating speed of the memory to less than the system clock speed.

FIG. 2 is a block diagram of a conventional memory module 120. A plurality of bus lines connected to a microprocessor (not shown) or a memory controller (not shown), typically a clock bus, an address bus and a command bus, are arranged on a system board. The memory module 100 includes a plurality of memory chips 101, 102, . . . , 106, a phase locked loop (PLL) 107 and a register 108.

The PLL 107 receives a clock signal CLK loaded on the clock bus line and generates a plurality of internal clock signals ICLK0, ICLK1, . . . , ICLK6. It is assumed here that the plurality of internal clock signals ICLK0, ICLK1, . . . , ICLK6 are ideal signals having the same slew rate and duty cycle without skew. Since the plurality of internal clock signals ICLK0, ICLK1, . . . , ICLK6 are synchronized in phase with the clock signal CLK, they have the same frequency as that of the clock signal CLK. The internal clock signal ICLK0 is supplied to the register 108, and the internal clock signals ICLK1, ICLK2, . . . , ICLK6 are supplied to the memory chips 101, 102, . . . , 106. In FIG. 2, one clock signal is connected to one memory chip. However, in actual applications, the number of corresponding memory chips for one clock signal may vary. The register 108 receives the address signal ADDR and the command signal CMD in response to the internal clock signal and transmits the received signals to the respective memory chips 101, 102, . . . , 106.

Since the memory module 120 receives only one clock signal CLK and generates a plurality of internal clock signals ICLK1, ICLK2, . . . , ICLK6, the frequencies of the internal clock signals ICLK1, ICLK2, . . . , ICLK6 increase as the frequency of the clock signal CLK increases in a high-performance system. Since the memory chips 101, 102, . . . , 106, which receive the internal clock signals ICLK1, ICLK2, . . . , ICLK6 and operate responsive thereto, may be constructed of devices suitable for high-frequency operation, no problems arise from their operation. However, it is doubtful whether the register 108 can function to receive the address signal ADDR and the command signal CMD at a timing corresponding to the frequency of the internal clock signal ICLK0, that is, the high frequency clock signal CLK, and to then transmit the received signals to the memory chips 101, 102, . . . , 106, in synchronization with the same high frequency clock signal CLK. As such, the operating characteristics of the register 108 may also limit the effective operating speed of the memory to less than the system clock speed.

SUMMARY OF THE INVENTION

It is an objective of the present invention to provide a semiconductor memory device which can utilize operable frequencies of an address signal and a command signal even if the frequency of a system clock signal is increased.

It is another objective of the present invention to provide a system having a memory device and a memory module which can utilize a clock signal having a sufficiently low frequency which is suitable for the operation of a register even if the frequency of a system clock signal is increased.

According to one aspect of the present invention, a semiconductor memory device includes a clock buffer which receives an external clock signal, and which outputs a first internal clock signal having a frequency which is lower than a frequency of the external clock signal and a second internal clock signal having a frequency which is the same as the frequency of the external clock signal; an address buffer which receives an address signal at a timing of the first internal clock signal; and a data buffer which inputs/outputs data at a timing of the second internal clock signal.

According to another aspect of the present invention, a semiconductor memory device includes a clock buffer which receives an external clock signal and a control signal, and which is responsive to the control signal to output a first internal clock signal having a frequency which is lower than a frequency of the external clock signal and a second internal clock signal having a frequency which is the same as the frequency of the external clock signal; a controller which outputs the control signal designating the frequency of the first internal clock signal relative to the frequency of the second internal clock signal; an address buffer which receives an address signal at a timing of the first internal clock signal; a command buffer which receives a command signal at a timing of the first internal clock signal; and a data buffer which inputs/outputs data at a timing of the second internal clock signal.

According to still another aspect of the present invention, a semiconductor memory system includes a memory controller; a plurality of bus lines which are connected to the memory controller and which transfer an address signal, a command signal and data; and a memory module having a plurality of semiconductor memory devices connected to the memory controller through the plurality of bus lines, wherein each of the semiconductor memory device comprises (a) a clock buffer which receives an external clock signal and a control signal, and which is responsive to the control signal to outputs a first internal clock signal having a frequency which is lower than a frequency of the external clock signal and a second internal clock signal having a frequency which is the same as the frequency of the external clock signal, (b) a controller which outputs the control signal designating the frequency of the first internal clock signal relative to the frequency of the second internal clock signal, (c) an address buffer which receives the address signal at a timing of the first internal clock signal, (d) a command buffer which receives the command signal at a timing of the first internal clock signal, (e) and a data buffer which inputs/outputs the data at a timing of the second internal clock signal.

According to yet another aspect of the present invention, a semiconductor memory system includes a memory controller which generates a first clock signal, a second clock signal having a frequency which is greater than that of the first clock signal, an address signal, a command signal and data; and a memory module having a plurality of semiconductor memory devices connected to the memory controller through bus lines on which the first clock signal, the second clock signal, the address signal, the command signal and the data are loaded, wherein each of the semiconductor memory device comprises (a) an address buffer which receives the address signal at a timing of the first clock signal, (b) a command buffer which receives the command signal at a timing of the first clock signal, and (c) a data buffer which inputs/outputs data at a timing of the second clock signal.

According to another aspect of the present invention, a system comprises a plurality of bus lines which respectively transfer a first clock signal, a second clock signal, an address signal and a command signal, respectively, wherein a frequency of the first clock signal is different than a frequency of the second clock signal; a memory module which is connected to the plurality of bus lines and which contains a plurality of memory chips, wherein each of the memory chips comprises (a) an address buffer, connected to the bus line of the first clock signal and the bus line of the address signal, which receives the address signal at a timing of the first internal clock signal, (b) a command buffer, connected to the bus line of the first clock signal and the bus line of the command signal, which receives the command signal at a timing of the internal clock signal, and (c) a data buffer, connected to the bus line of the second clock signal, which inputs/outputs data at a timing of the second clock signal.

According to yet another aspect of the present invention, a system comprises a plurality of bus lines which respectively transfer a first clock signal, a second clock signal, an address signal and a command signal, respectively, wherein a frequency of the first clock signal is different than a frequency of the second clock signal; and a memory module which is connected to the plurality of bus lines and which comprises (a) a register which is connected to the bus of the first clock signal, the bus of the address signal, and the bus of the command signal, and which stores the address signal and the command signal at a timing of the first clock signal, and (b) a plurality of memory chips which are each connected to the bus line of the second clock signal and which receives the address signal and command signal stored in the register at a timing of the second clock signal, wherein the address signal and the command signal are transmitted to the memory chips in one direction of the memory module or in two directions from a center of the memory module.

According to another aspect of the present invention, a system comprises a plurality of bus lines which respectively transfer a system clock signal, an address signal and a command signal, respectively; a phase lock loop which receives the system clock signal and which outputs a first clock signal and a second clock signal, wherein a frequency of the first clock signal is different than a frequency of the second clock signal; and a memory module which is connected to the plurality of bus lines and which comprises (a) a register which is connected to the bus of the first clock signal, the bus of the address signal, and the bus of the command signal, and which stores the address signal and the command signal at a timing of the first clock signal, and (b) a plurality of memory chips which are each connected to the bus line of the second clock signal and which receives the address signal and command signal stored in the register at a timing of the second clock signal, wherein the address signal and the command signal are transmitted to the memory chips in one direction of the memory module or in two directions from a center of the memory module.

According to still another aspect of the present invention, a system comprises a plurality of bus lines which respectively transfer a first clock signal, a second clock signal, an address signal and a command signal, respectively, wherein a frequency of the first clock signal is different than a frequency of the second clock signal; and a memory module which is connected to the plurality of bus lines and which comprises (a) a register which is connected to the bus of the first clock signal, the bus of the address signal, and the bus of the command signal, and which stores the address signal and the command signal at a timing of the first clock signal, (b) a phase locked loop which is connected to the bus of the second clock signal and which outputs a plurality of internal clock signals having a same frequency as the second clock signal, and (c) a plurality of memory chips which are each connected to the phase locked loop and which receives the address signal and command signal stored in the register at a timing of a respective one of the plurality of internal clock signals, wherein the address signal and the command signal are transmitted to the memory chips in one direction of the memory module or in two directions from a center of the memory module.

Preferably, the system clock signal, the address signal and the command signal are supplied from a memory controller or microprocessor mounted in the system and the frequency of the first clock signal is lower than that of the second clock signal. The memory module may include two or more module pins receiving the first and second clock signals.

BRIEF DESCRIPTION OF THE DRAWINGS

The above and other objectives and advantages of the present invention will become more readily apparent from the detailed description that follows, with reference to the accompany drawings, in which.

DESCRIPTION OF THE PREFERRED EMBODIMENTS

Preferred embodiments of the present invention will now be described in detail with reference to the accompanying drawings, in which like elements are denoted by like references numbers.

Figure 1:
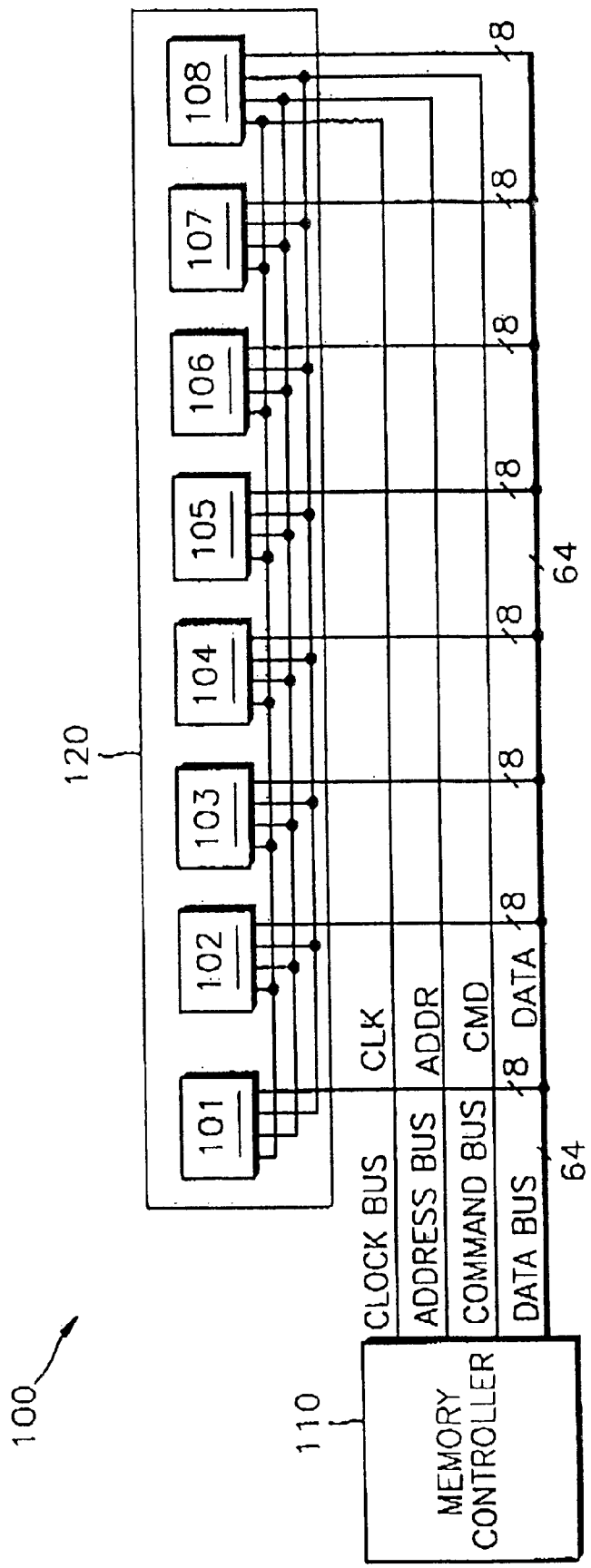
FIG. 1 depicts a conventional memory controller and a memory module of a CPU system board.
Figure 2:
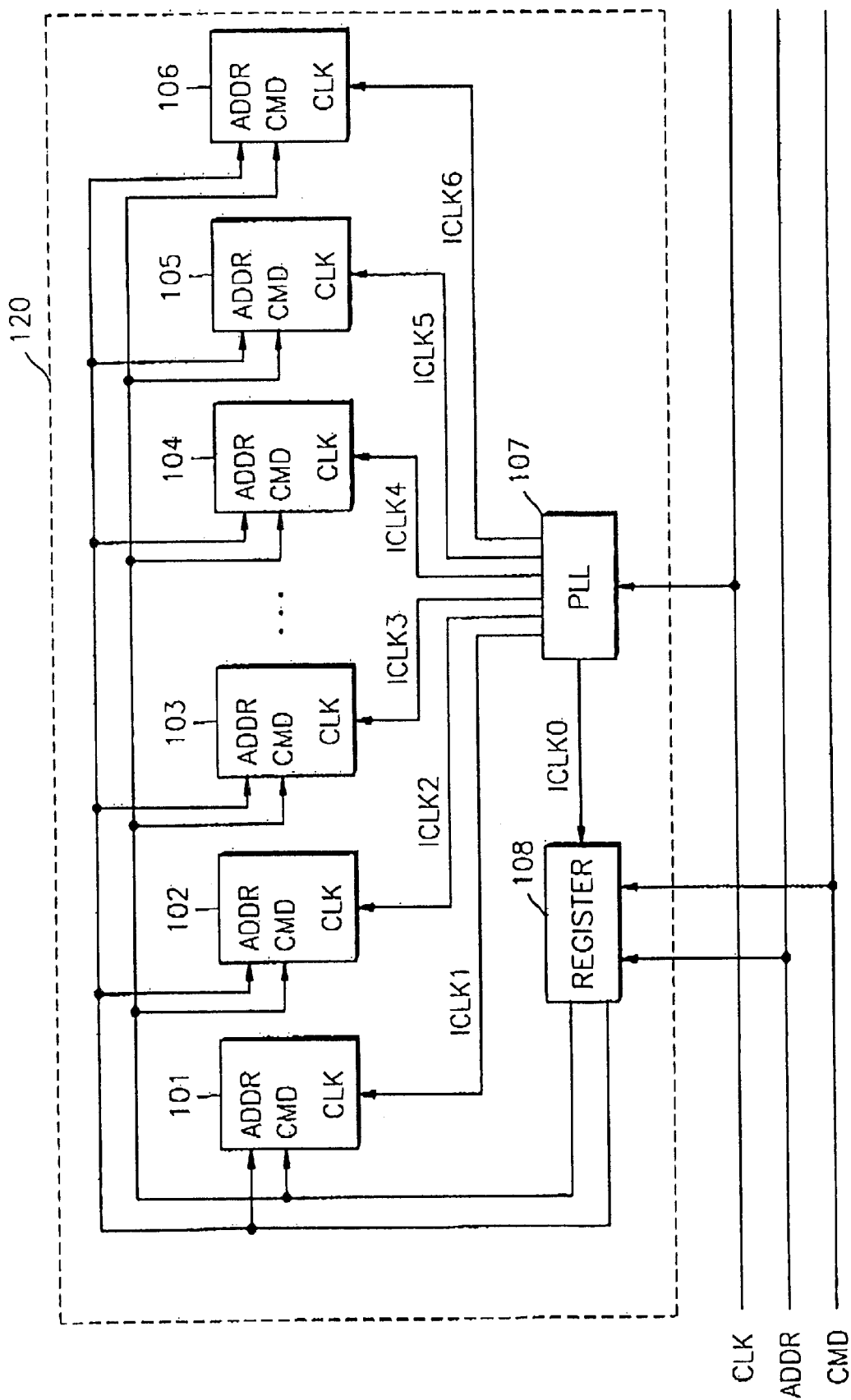
FIG. 2 is a block diagram of a conventional memory module mounted on the system board shown in FIG. 1.
Figure 3:
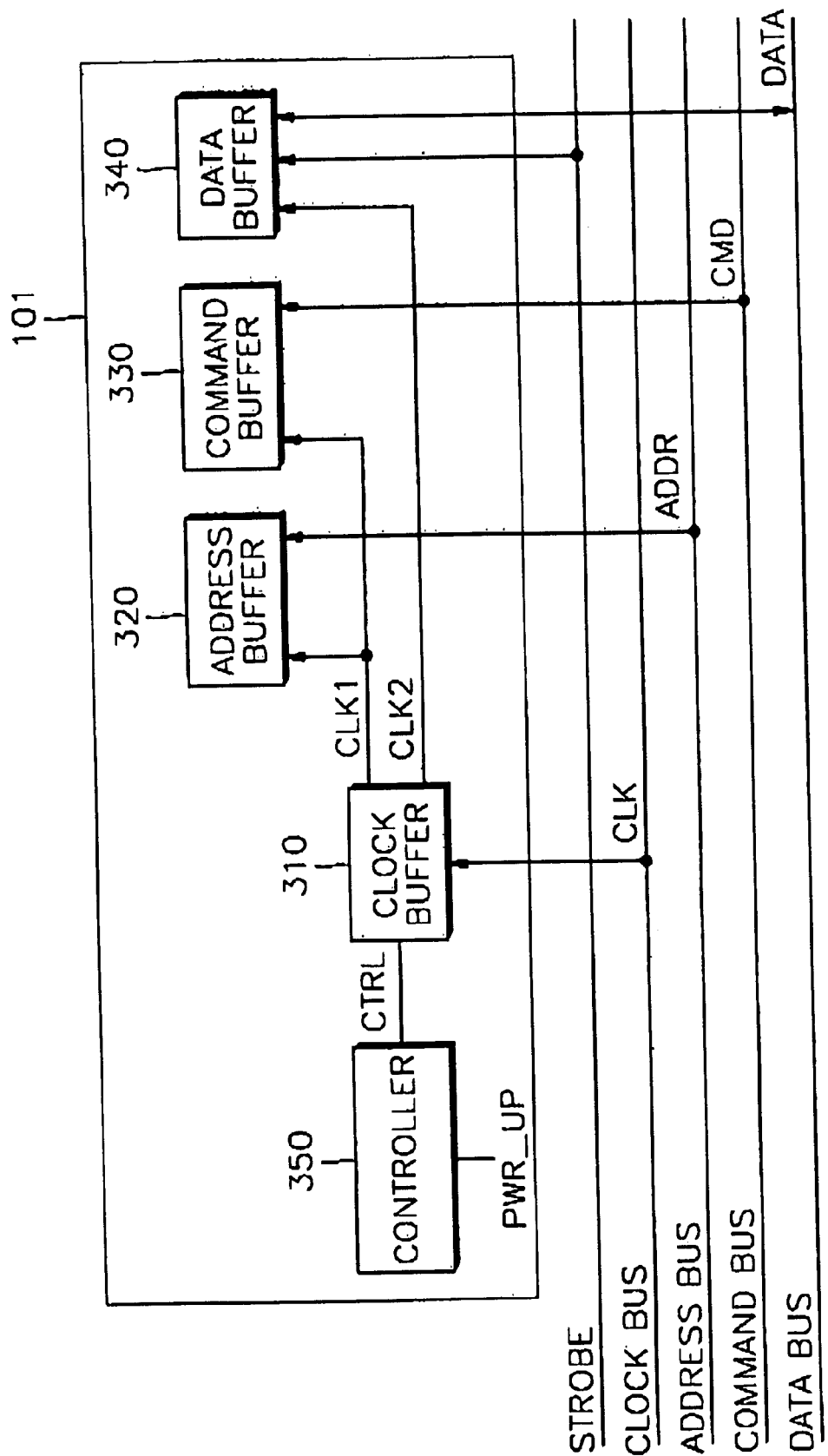
FIG. 3 is a block diagram of a semiconductor memory device according to a first embodiment of the present invention.

FIG. 3 depicts a semiconductor memory device according to a first embodiment of the present invention. A semiconductor memory device 101, which generally corresponds to one of memory chips included in a memory module (e.g., module 120 of FIG. 1), includes a clock buffer 310, an address buffer 320, a command buffer 330, a data buffer 340 and a controller 350. The clock buffer 310 receives a clock signal CLK (referred to herein as an "external clock signal") loaded on a CLOCK BUS, and generates internal clock signals CLK1 and CLK2. The relative frequencies of the first internal clock signal CLK1 and the second clock signal CLK2 are determined by the clock buffer 310 in response to a control signal CTRL output from the controller 350. For example, the control signal CTRL may designate which of a rising or falling edge of the external clock signal CLK that the first internal clock signal CLK1 is to be synchronized. The controller 350 may be constituted by a mode resister set (MRS), and the control signal CTRL may be set at a time of powering-up the semiconductor memory device 101 and/or upon cancellation of a power-down mode.

The frequency of the first internal clock signal CLK1 relative to the frequency of the second internal clock signal CLK2 may vary according to the control signal CTRL. The case where the frequency of the first internal clock signal CLK1 is lower than that of the second internal clock signal CLK2 will now be described. In this example, the frequency of the second internal clock signal CLK2 is substantially the same as that of the external clock signal CLK. As such, assuming that the frequency of the external clock signal CLK is 400 MHz, then the second internal clock signal CLK2 also has a frequency of 400 MHz. The first internal clock signal CLK1 may, for example, have a frequency which is half or less that of the second internal clock signal CLK2. Thus, assuming again that the frequency of the second internal clock signal CLK2 is 400 MHz, then the first internal clock signal CLK1 may have a frequency of 200 MHz or 100 MHz.

The address buffer 320 receives the address signal ADDR at a timing of the first internal clock signal CLK1. Likewise, the command buffer 330 receives the command signal CMD at a timing of the first internal clock signal CLK1. On the other hand, the data buffer 340 inputs/outputs data DATA at a timing of the second internal clock signal CLK2.

In operation, the semiconductor memory device 101 receives the high-frequency external clock signal CLK. In this embodiment, the second internal clock signal CLK2 generated by the clock buffer 310 has the same frequency as the external clock signal CLK, e.g., 400 MHz. This means that the semiconductor memory device 101 inputs/outputs data DATA in synchronization with the external clock signal CLK, which is the operating frequency of a memory controller or a microprocessor mounted on the system board.

In contrast, the address signal ADDR and the command signal CMD are processed in synchronization with the first internal clock signal CLK1 which has a lower frequency than that of the external clock signal CLK. In this manner, the high-frequency device limitations previously imposed by the loads of the ADDRESS BUS line and the COMMAND BUS line may be overcome, thus making the semiconductor memory device 101 well adapted to high-frequency operations.

Figure 4:
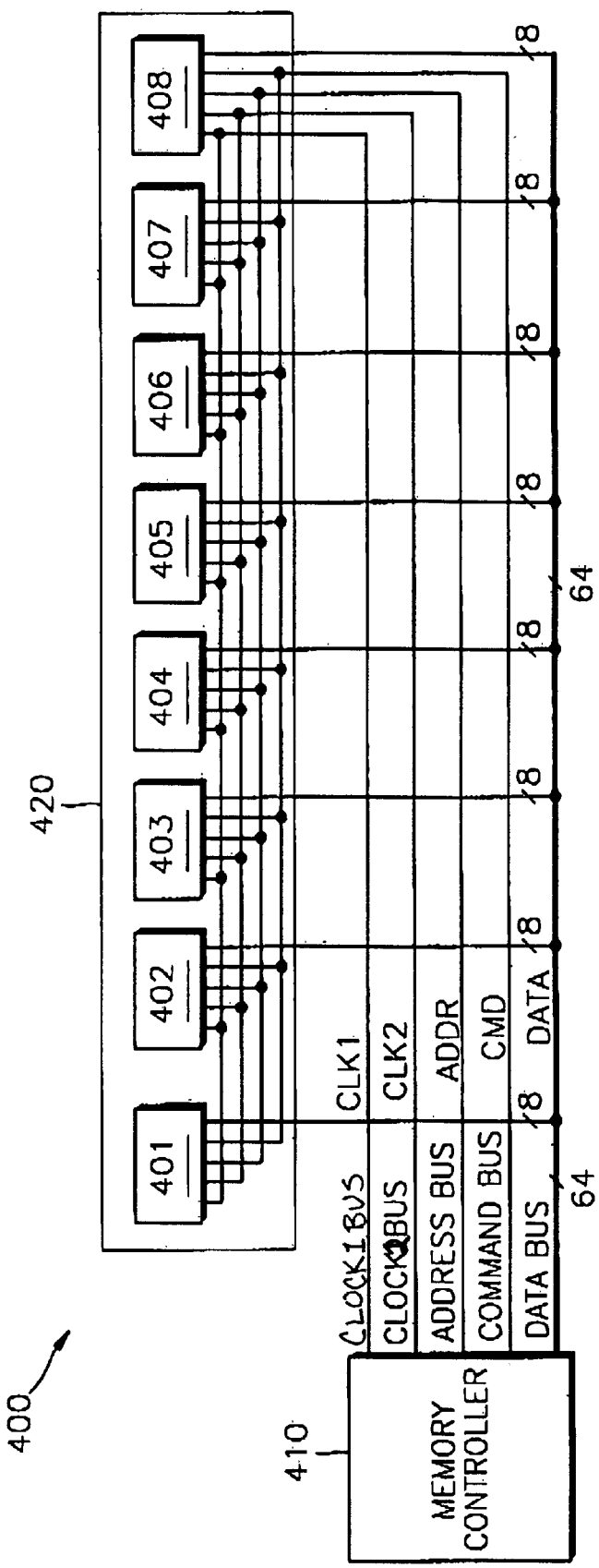
FIG. 4 depicts a system board having a semiconductor memory device according to a second embodiment of the present invention.

A data strobe signal STROBE may be applied to the data buffer 340 to control latching of the high-frequency data DATA. In this case, the data buffer 340 inputs/outputs data DATA in response to an edge of the strobe signal STROBE. In particular, a single data rate (SDR) dynamic random access memory (DRAM) inputs/outputs data at every rising or falling edge of the strobe signal STROBE. A double data rate (DDR) DRAM inputs/outputs data at both rising and falling edges of the strobe signal STROBE FIG. 4 depicts a system board 400 having a semiconductor memory device according to a second embodiment of the present invention. The system board 400 includes a memory controller 410 and a memory module 420 having a plurality of memory chips 401, 402, . . . , 408. The memory controller 410 generates a first clock signal CLK1, a second clock signal CLK2, an address signal ADDR, a command signal CMD and a data signal DATA and transmits the generated signals to a CLOCK1 BUS, a CLOCK2 BUS, an ADDRESS BUS, a COMMAND BUS and a DATA BUS. The frequency of the second clock signal CLK2 of this second embodiment is substantially the same as that of the external clock signal CLK of the first embodiment. Likewise, the frequency of the first clock signal CLK1 of this second embodiment generally corresponds to that of the first clock signal CLK1 of the first embodiment.

Each of the memory chips 401, 402, . . . , 408 is connected to the CLOCK1 BUS, the CLOCK2 BUS, the ADDRESS BUS, the COMMAND BUS and the DATA BUS, and receives the first clock signal CLK1, the second clock signal CLK2, the address signal ADDR, the command signal CMD and the data signal DATA.

Figure 5:
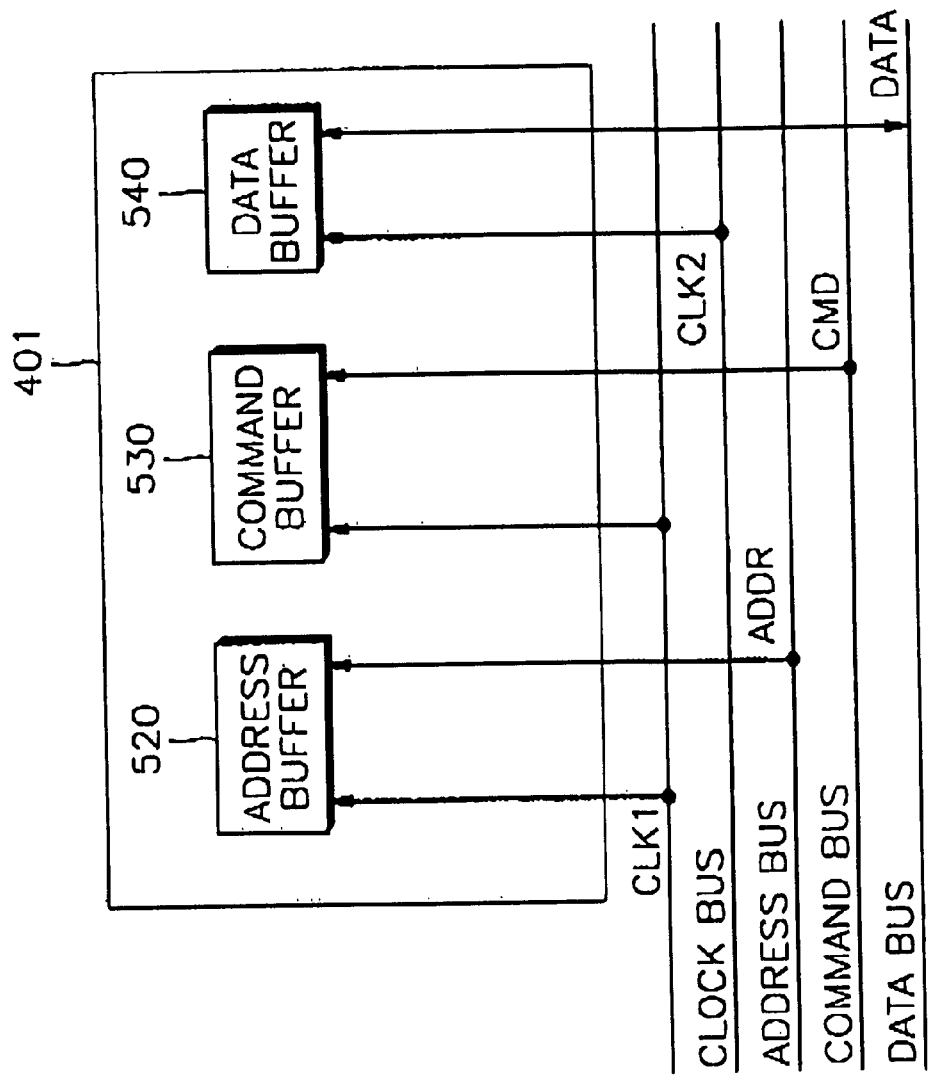
FIG. 5 is a block diagram of the semiconductor memory device shown in FIG. 4.

FIG. 5 illustrates an example of a memory chip 401 contained in the memory module 420 of FIG. 4. The memory chip 401 includes an address buffer 520, a command buffer 530 and a data buffer 540. The address buffer 520 receives the first clock signal CLK1 and the address signal ADDR, and the command buffer 530 receives the first clock signal CLK1 and the command signal CMD. The data buffer 540 receives the second clock signal CLK2 and the data signal DATA.

As with the first embodiment, the address signal ADDR and the command signal CMD are processed in synchronization with the first internal clock signal CLK1 which has a lower frequency than that of an external clock signal CLK (or second internal clock signal CLK2). In this manner, the high-frequency device limitations previously imposed by the loads of the ADDRESS BUS line and the COMMAND BUS line may be overcome.

Figure 6:
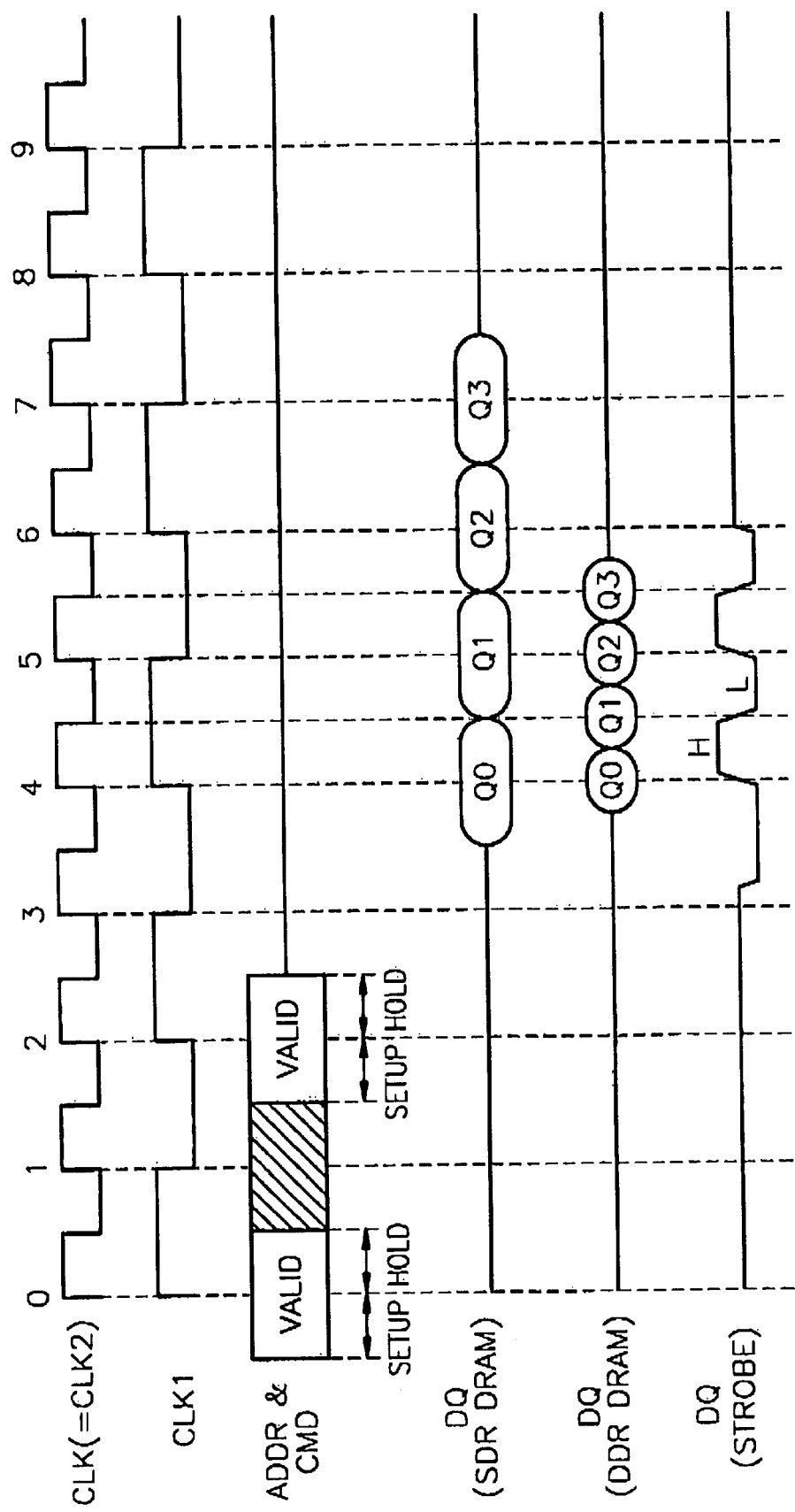
FIG. 6 is an operational timing diagram of the semiconductor memory devices shown in FIG. 3 and 5.

An operational timing diagram of the memory chips of the first and second embodiments is shown in FIG. 6. Generally, the period of the first internal clock signal CLK1 is preferably an integer multiple of a period of the external clock signal CLK. In this example, the frequency of the first internal clock signal CLK1 is half that of the external clock signal CLK (or the second internal clock signal CLK2). The address signal ADDR and the command signal CMD include setup and hold time margins relative to the rising edge of the first internal clock signal CLK1. In the case of a single data rate (SDR) DRAM semiconductor memory device, the data is output through a data terminal DQ at every rising or falling edge of the second internal clock signal CLK2 (which has the same frequency as the external clock signal CLK). In the case of a double data rate (DDR) DRAM semiconductor memory device, the data is output through a data terminal DQ at both the rising and falling edges of the second internal clock signal CLK2.

In the case where the data buffer included in the memory chip of the first or second embodiment is connected to receive a data strobe signal STROBE, the data is input/output at both the rising and falling edges of the data strobe signal STROBE as shown in FIG. 6. This operation generally corresponds to that of the DDR DRAM.

Figure 7:
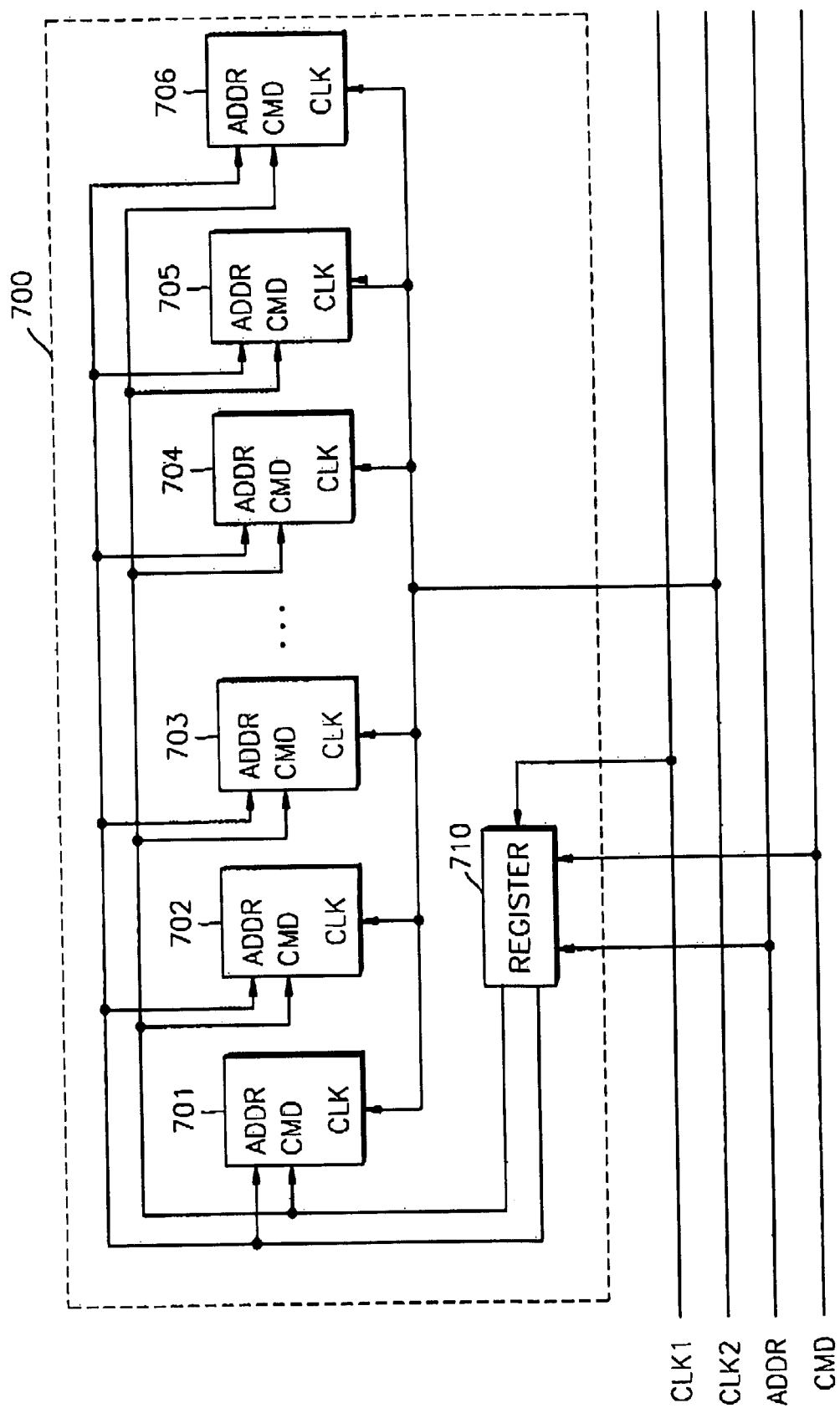
FIG. 7 depicts a system including a memory module according to a third embodiment of the present invention.

FIG. 7 depicts a memory module 700 according to a third embodiment of the present invention. The memory module 700 includes a plurality of memory chips 701, 702, . . . , 706, and a register 710. The register 710 is connected to receive a first clock signal CLK1, an address signal ADDR and a command signal CMD loaded on a system board. The register 710 stores the address signal ADDR and the command signal CMD at a timing of the first clock signal CLK1, and transfers the same to the memory chips 701, 702, . . . , 706. In this embodiment, the address signal ADDR and the command signal CMD output from the register 710 are transmitted in one direction (left-to-right in FIG. 7) across the memory module 700 to the memory chips 701, 702, . . . , 706.

The memory chips 701, 702, . . . , 706 are connected to received the second clock signal CLK2 loaded on the system board and the address signal ADDR and the command signal CMD output from the register 710. The second clock signal CLK2 has a higher frequency than the first clock signal CLK1. The first clock signal CLK1, the address signal ADDR and the command signal CMD may be directly supplied to the memory chips 701, 702, . . . , 706, i.e., without passing through the register 710 in the memory module 700. Here, the first clock signal CLK1 serves to drive an address buffer and a command buffer, which receive the address signal ADDR and the command signal CMD, respectively. The second clock signal CLK2 serves to drive data buffers. Thus, the first clock signal CLK1 having a low frequency is used as the operating clock signal of the address signal ADDR and the command signal CMD, and the second clock signal CLK2 having a high frequency is used to input/output data.

The first clock signal CLK1, the second clock signal CLK2, the address signal ADDR and the command signal CMD are supplied by a memory controller or microprocessor (not shown), and are connected to various devices, in particular, the memory module 700, through bus lines running on the system board.

Figure 8:
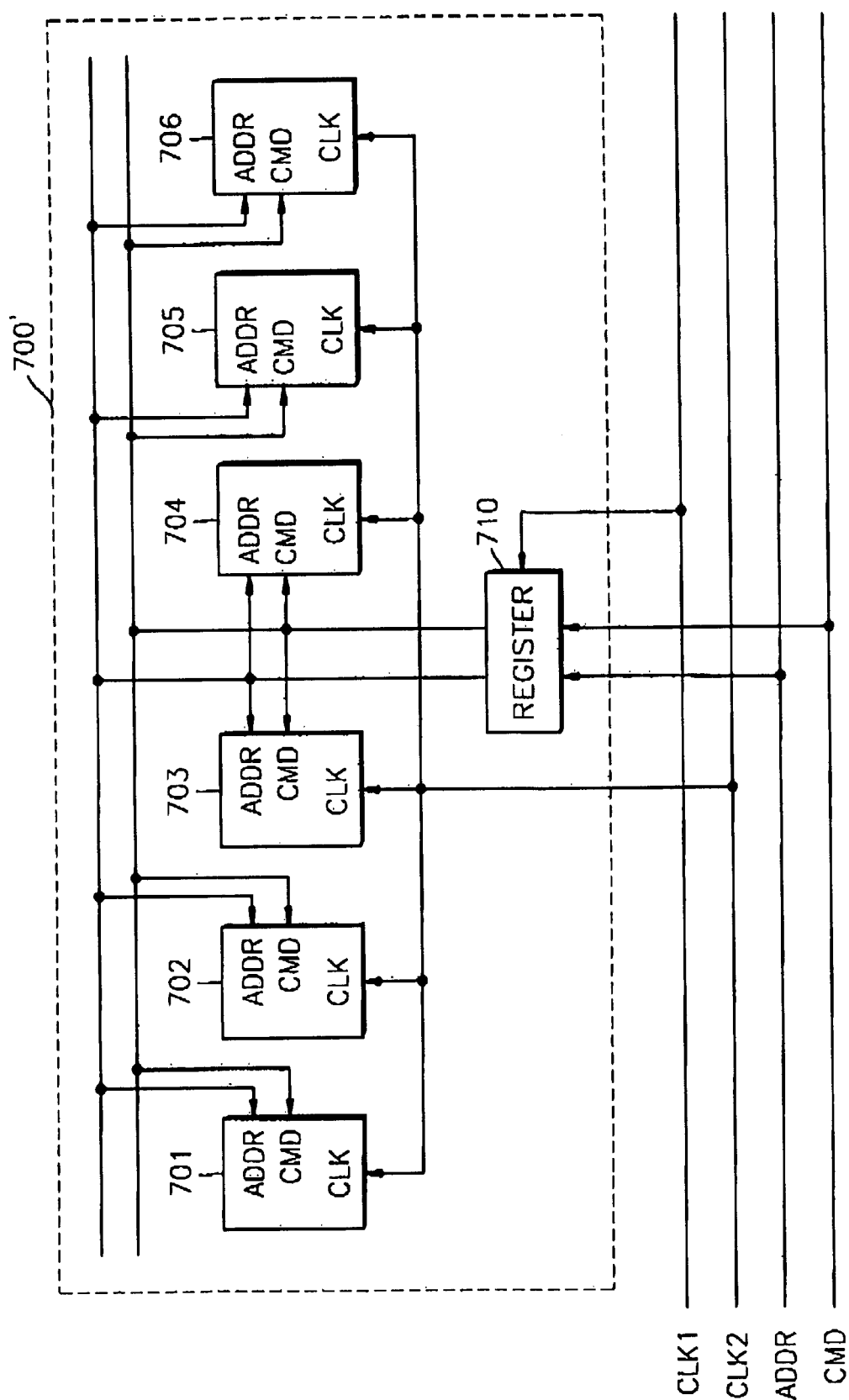
FIG. 8 depicts a system including a memory module according to a fourth embodiment of the present invention.

FIG. 8 illustrates a modification of FIG. 7 and represents a fourth embodiment of the present invention. Here, the address signal ADDR and a command signal CMD output from a register 710 are connected to memory chips 701, 702, . . . , 706 from the center of a memory module 700'. Accordingly, the address signal ADDR and the command signal CMD output from the register 710 are transmitted in two directions (center-to-left and center-to-right in FIG. 8) across the memory module 700 to the memory chips 701, 702, . . . , 706. The configuration of this embodiment reduces a difference in line load to the memory chips 701, 702, . . . , 706, and thereby reduces skew among the memory chips 710, 702, . . . , 706.

Figure 9:
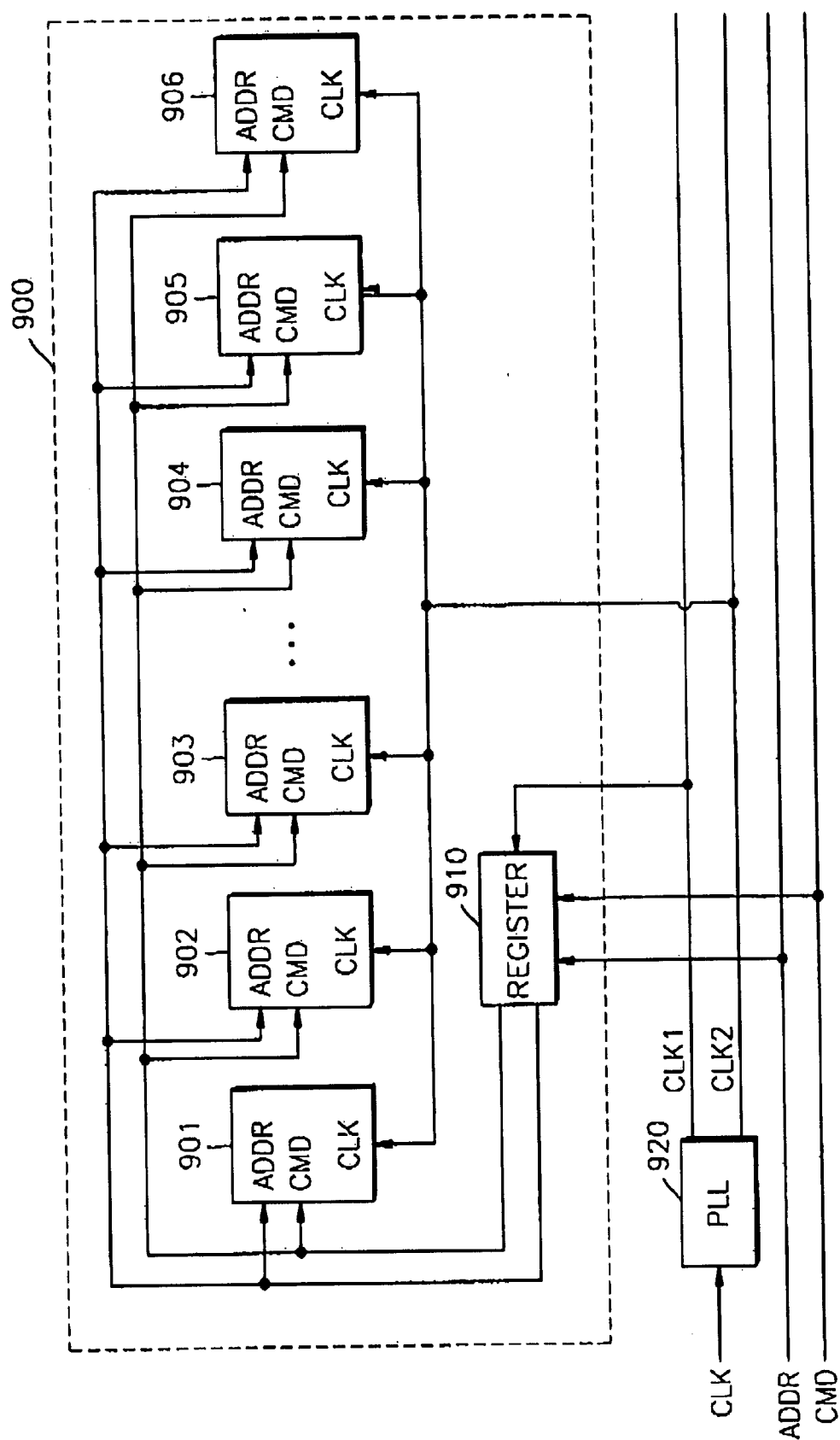
FIG. 9 depicts a system including a memory module according to a fifth embodiment of the present invention.

FIG. 9 illustrates another modification of FIG. 7 and represents a fifth embodiment of the present invention. Here, the first clock signal CLK1 and the second clock signal CLK2 are supplied by a phase locked loop (PLL) which receives a system clock signal CLK loaded on the system board, rather than by a memory controller or microprocessor.

Figure 10:
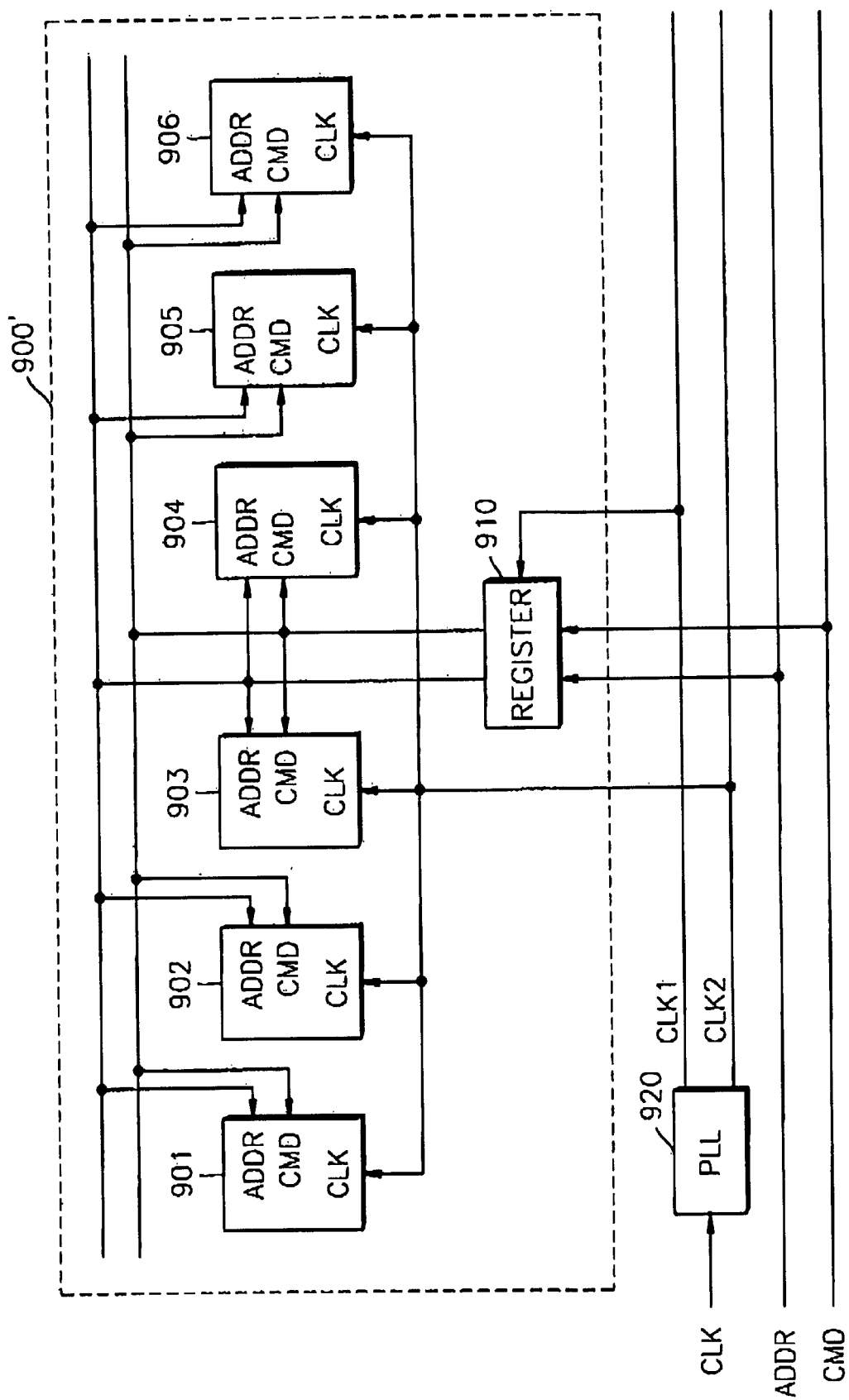
FIG. 10 depicts a system including a memory module according to a sixth embodiment of the present invention.

FIG. 10 illustrates a modification of FIG. 9 and represents a fourth embodiment of the present invention. Here, like in FIG. 8, the address signal ADDR and a command signal CMD output from a register 910 are connected to memory chips 901, 902, . . . , 906 from the center of a memory module 900'. Accordingly, the address signal ADDR and the command signal CMD output from the register 910 are transmitted in two directions (center-to-left and center-to-right in FIG. 10) across the memory module 900 to the memory chips 901, 902, . . . , 906. The configuration of this embodiment reduces a difference in line load to the memory chips 901, 902, . . . , 906, and thereby reduces skew among the memory chips 910, 902, . . . , 906.

The memory modules shown in FIGS. 7 through 10 operate in substantially the same manner, which will now be described with reference to the memory module exemplified in FIG. 7. The frequency of the first clock signal CLK1 is lower than that of the second clock signal CLK2. The first clock signal CLK1 having the low frequency is used as the operating clock signal of the register 710, and the second clock signal CLK2 having the high frequency is used as the operating clock signals of the memory chips 701, 702, . . . , 706, to thereby adapt the performance of the register 710 operating at a relatively low speed, to the higher operating speeds of the memory chips 701, 702, . . . , 706. The memory chips 701, 702, . . . , 706 may consist of high-speed synchronous DRAMs, for example, DDR DRAMs or SDR DRAMs.

In contrast to the conventional memory module which receives a single clock signal and distributes the same throughout the memory module, the memory module 700 of the present invention receives two clock signals CLK1 and CLK2 and connects the same to devices operating at different frequencies, that is, the register 710 and the memory chips 701, 702, . . . , 706, respectively. Thus, the memory module 700 includes two module pins used to receive the two clock signals CLK1 and CLK2.

In the memory modules 700, 700', 900 and 900' shown in FIGS. 7 through 10, since the registers and memory chips operating at different frequencies in the memory modules are selectively supplied with clock signals having the corresponding frequencies, the register having the relatively low operating frequency is operated in a stable manner.

Figure 11:
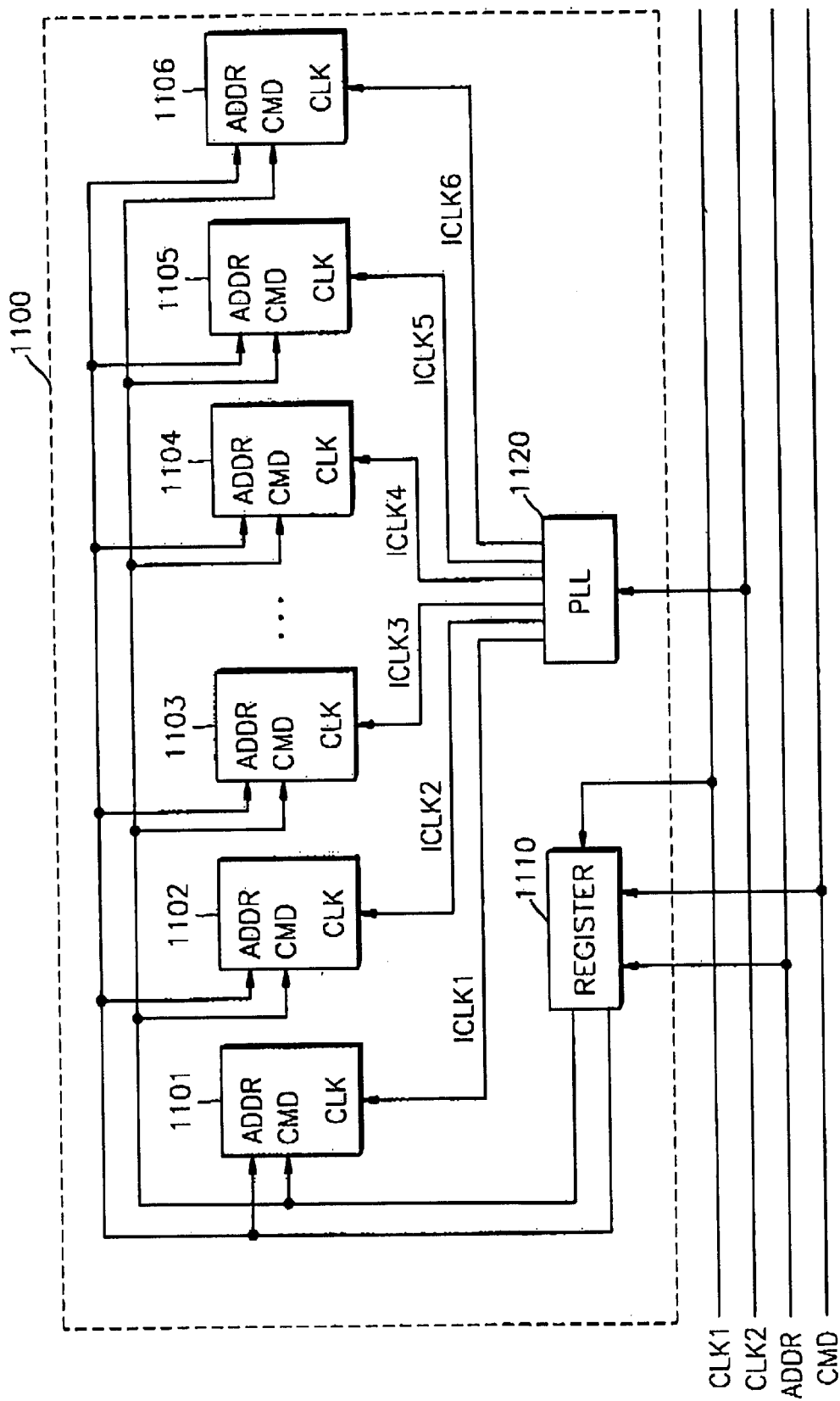
FIG. 11 depicts a system including a memory module according to a seventh embodiment of the present invention.

FIG. 11 depicts a memory module 1100 according to a seventh embodiment of the present invention. The memory module 1100 is substantially the same as the memory module 700 shown in FIG. 7, except that in the present embodiment a phase lock loop 1120 receives the second clock signal CLK2 and distributes the same to the memory chips 1101, 1102, . . . , 1106.

In particular, the PLL 1120 receives the second clock signal CLK2 and generates a plurality of internal clock signals ICLK1, ICLK2, . . . , ICLK6, and transmits the same to the memory chips 1101, 1102, . . . , 1106. The internal clock signals ICLK1, ICLK2, . . . , ICLK6 have the same slew rate and duty cycle and approximate ideal signals without skew. Also, since the internal clock signals ICLK1, ICLK2, . . . , ICLK6 are synchronized with the second clock signal CLK2 in phase, they have the same frequency as the second clock signal CLK2. Thus, the internal clock signals ICLK1, ICLK2, . . . , ICLK6 also have a high frequency.

Figure 12:
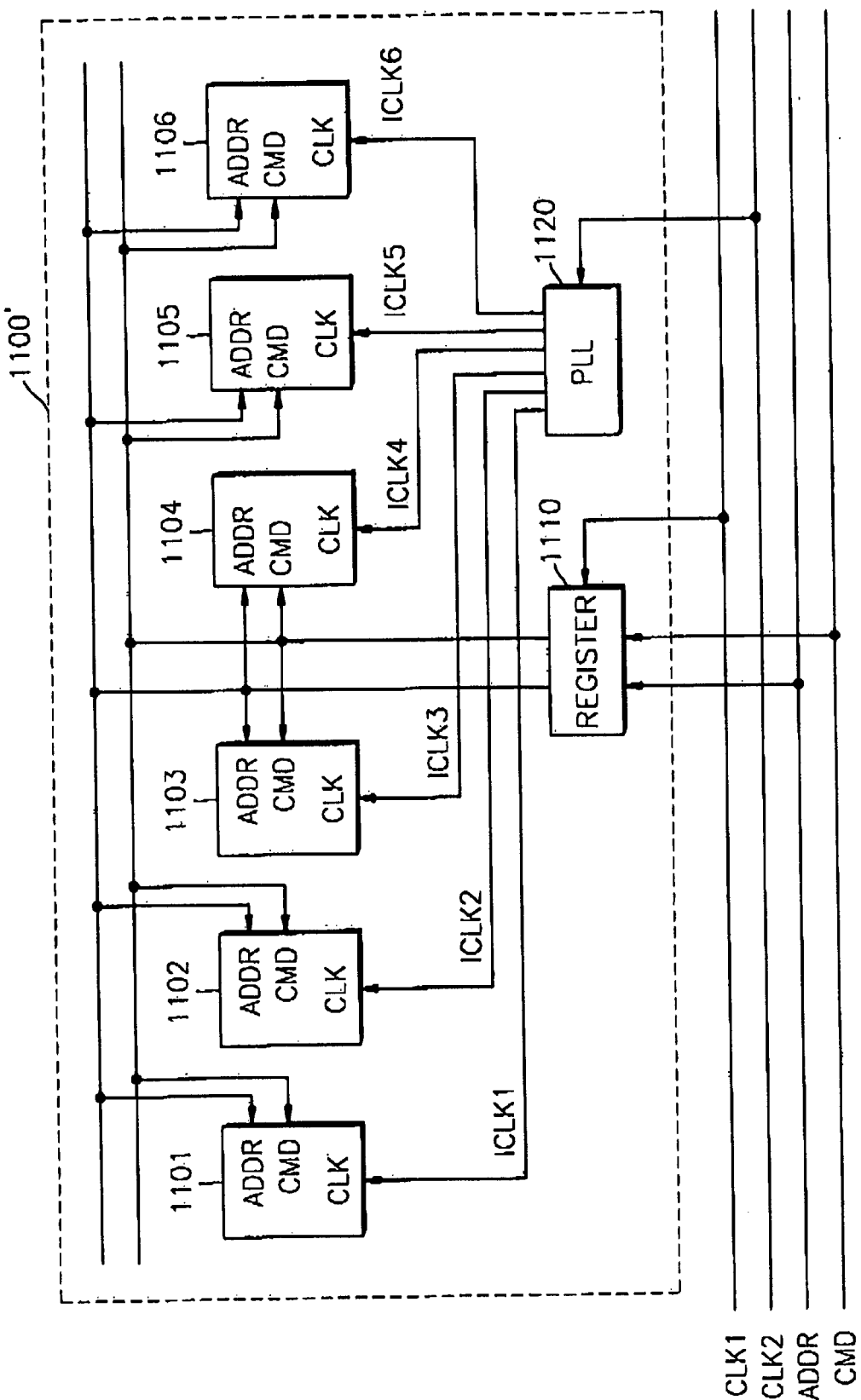
FIG. 12 depicts a system including a memory module according to an eighth embodiment of the present invention.

FIG. 12 illustrates a modification of FIG. 11 and represents an eighth embodiment of the present invention. Here, like in FIG. 8, the address signal ADDR and a command signal CMD output from a register 1110 are connected to memory chips 1101, 1102, . . . , 1106 from the center of a memory module 1100'. Accordingly, the address signal ADDR and the command signal CMD output from the register 1110 are transmitted in two directions (center-to-left and center-to-right in FIG. 12) across the memory module 1100' to the memory chips 1101, 1102, . . . , 1106. The configuration of this embodiment reduces a difference in line load to the memory chips 1101, 1102, . . . , 1106, and thereby reduces skew among the memory chips 1110,1102, . . . , 1106.

In the memory modules 1100 and 1100' shown in FIGS. 11 and 12, since the registers and memory chips operating at different frequencies in the memory modules are selectively supplied with clock signals having the corresponding frequencies, the register having the relatively low operating frequency is operated in a stable manner.

Although specific embodiments of the invention have been described herein for illustrative purposes, various modifications and equivalents thereof can be made without departing from the spirit and scope of the invention, as will be recognized by those skilled in the relevant art. As one example only, it is noted that the invention has been described above as employing two clock signals, that is, the first clock signal CLK1 and the second clock signal CLK2. However, the memory module may also be configured to receive more than two clock signals having different operating frequencies which are then connected to various devices operating at different frequencies. Accordingly, the invention is not intended to be limited to the disclosure, but instead its scope is to be determined entirely by the following claims.

What is claimed is:

1. A semiconductor memory device comprising:
a clock buffer which receives an external clock signal, and which outputs a first internal clock signal having a frequency which is lower than a frequency of the external clock signal and a second internal clock signal having a frequency which is the same as the frequency of the external clock signal;
an address buffer which receives an address signal at a timing of the first internal clock signal; and
a data buffer which inputs/outputs data at a timing of the second internal clock signal.

2. The semiconductor memory device according to claim 1, further comprising a command buffer which receives a command signal at a timing of the first internal clock signal.

3. The semiconductor memory device according to claim 1, wherein a period of the first internal clock signal is an integer multiple of a period of the external clock signal.

4. The semiconductor memory device according to claim 1, wherein the data buffer receives a data strobe signal and inputs/outputs the data at every rising and falling edge of the data strobe signal.

5. A semiconductor memory device comprising:
a clock buffer which receives an external clock signal and a control signal, and which is responsive to the control signal to outputs a first internal clock signal having a frequency which is lower than a frequency of the external clock signal and a second internal clock signal having a frequency which is the same as the frequency of the external clock signal;
a controller which outputs the control signal designating the frequency of the first internal clock signal relative to the frequency of the second internal clock signal;
an address buffer which receives an address signal at a timing of the first internal clock signal;
a command buffer which receives a command signal at a timing of the first internal clock signal; and
a data buffer which inputs/outputs data at a timing of the second internal clock signal.

6. The semiconductor memory device according to claim 5, wherein the control signal is generated by the controller upon a power-up of the semiconductor memory device or upon cancellation of a power-down mode of the semiconductor device.

7. The semiconductor memory device according to claim 5, wherein the control signal designates which of a rising or falling edge of the external clock signal that the first internal clock signal is to be synchronized.

8. The semiconductor memory device according to claim 5, wherein the data buffer receives a data strobe signal and inputs/outputs the data at every rising and falling edge of the data strobe signal.

9. The semiconductor memory device according to claim 5, wherein a period of the first internal clock signal is an integer multiple of a period of the external clock signal.

10. A semiconductor memory system comprising:
a memory controller;
a plurality of bus lines which are connected to the memory controller and which transfer an address signal, a command signal and data; and
a memory module having a plurality of semiconductor memory devices connected to the memory controller through the plurality of bus lines, wherein each of the semiconductor memory device comprises (a) a clock buffer which receives an external clock signal and a control signal, and which is responsive to the control signal to outputs a first internal clock signal having a frequency which is lower than a frequency of the external clock signal and a second internal clock signal having a frequency which is the same as the frequency of the external clock signal, (b) a controller which outputs the control signal designating the frequency of the first internal clock signal relative to the frequency of the second internal clock signal, (c) an address buffer which receives the address signal at a timing of the first internal clock signal, (d) a command buffer which receives the command signal at a timing of the first internal clock signal, (e) and a data buffer which inputs/outputs the data at a timing of the second internal clock signal.

11. The semiconductor memory system according to claim 10, wherein the memory controller is implemented by a microprocessor.

12. The semiconductor memory system according to claim 10, wherein the control signal is generated by the controller upon a power-up of the semiconductor memory device or upon cancellation of a power-down mode of the semiconductor device.

13. The semiconductor memory device according to claim 10, wherein the control signal designates which of a rising or falling edge of the external clock signal that the first internal clock signal is to be synchronized.

14. The semiconductor memory system according to claim 10, wherein the data buffer receives a data strobe signal and inputs/outputs the data at every rising and falling edge of the data strobe signal.

15. The semiconductor memory system according to claim 10, wherein a period of the first internal clock signal is an integer multiple of a period of the external clock signal.

16. A semiconductor memory system comprising:
a memory controller which generates a first clock signal, a second clock signal having a frequency which is greater than that of the first clock signal, an address signal, a command signal and data; and
a memory module having a plurality of semiconductor memory devices connected to the memory controller through bus lines on which the first clock signal, the second clock signal, the address signal, the command signal and the data are loaded, wherein each of the semiconductor memory device comprises (a) an address buffer which receives the address signal at a timing of the first clock signal, (b) a command buffer which receives the command signal at a timing of the first clock signal, and (c) a data buffer which inputs/outputs data at a timing of the second clock signal.

17. The semiconductor memory system according to claim 16, wherein the memory controller is implemented by a microprocessor.

18. The semiconductor memory system according to claim 16, wherein the data buffer receives a data strobe signal and inputs/outputs the data at every rising and falling edge of the data strobe signal.

19. A system comprising:
a plurality of bus lines which respectively transfer a first clock signal, a second clock signal, an address signal and a command signal, respectively, wherein a frequency of the first clock signal is different than a frequency of the second clock signal;
a memory module which is connected to the plurality of bus lines and which contains a plurality of memory chips, wherein each of the memory chips comprises (a) an address buffer, connected to the bus line of the first clock signal and the bus line of the address signal, which receives the address signal at a timing of the first clock signal, (b) a command buffer, connected to the bus line of the first clock signal and the bus line of the command signal, which receives the command signal at a timing of the first clock signal, and (c) a data buffer, connected to the bus line of the second clock signal, which inputs/outputs data at a timing of the second clock signal.

20. The system according to claim 19, further comprising a memory controller which supplies the first clock signal, the second clock signal, the address signal and the command signal.

21. The system according to claim 19, wherein the frequency of the first clock signal is lower than that of the second clock signal.

22. A system comprising:
a plurality of bus lines which respectively transfer a first clock signal, a second clock signal, an address signal and a command signal, respectively, wherein a frequency of the first clock signal is different than a frequency of the second clock signal; and
a memory module which is connected to the plurality of bus lines and which comprises (a) a register which is connected to the bus of the first clock signal, the bus of the address signal, and the bus of the command signal, and which stores the address signal and the command signal at a timing of the first clock signal, and (b) a plurality of memory chips which are each connected to the bus line of the second clock signal and which receives the address signal and command signal stored in the register at a timing of the second clock signal, wherein the address signal and the command signal are transmitted to the memory chips in one direction of the memory module.

23. The system according to claim 22, further comprising a memory controller which supplies the first clock signal, the second clock signal, the address signal and the command signal.

24. The system according to claim 22, wherein the frequency of the first clock signal is lower than the frequency of the second clock signal.

25. A system comprising:
a plurality of bus lines which respectively transfer a first clock signal, a second clock signal, an address signal and a command signal, respectively, wherein a frequency of the first clock signal is different than a frequency of the second clock signal; and
a memory module which is connected to the plurality of bus lines and which comprises (a) a register which is connected to the bus of the first clock signal, the bus of the address signal, and the bus of the command signal, and which stores the address signal and the command signal at a timing of the first clock signal, and (b) a plurality of memory chips which are each connected to the bus line of the second clock signal and which receives the address signal and command signal stored in the register at a timing of the second clock signal, wherein the address signal and the command signal are transmitted to the memory chips in two directions from a center of the memory module.

26. The system according to claim 25, further comprising a memory controller which supplies the first clock signal, the second clock signal, the address signal and the command signal.

27. The system according to claim 25, wherein the frequency of the first clock signal is lower than the frequency of the second clock signal.

28. A system comprising:
a plurality of bus lines which respectively transfer a system clock signal, an address signal and a command signal, respectively, a phase lock loop which receives the system clock signal and which outputs a first clock signal and a second clock signal, wherein a frequency of the first clock signal is different than a frequency of the second clock signal; and a memory module which is connected to the plurality of bus lines and which comprises (a) a register which is connected to the bus of the first clock signal, the bus of the address signal, and the bus of the command signal, and which stores the address signal and the command signal at a timing of the first clock signal, and (b) a plurality of memory chips which are each connected to the bus line of the second clock signal and which receives the address signal and command signal stored in the register at a timing of the second clock signal, wherein the address signal and the command signal are transmitted to the memory chips in one direction of the memory module.

29. The system according to claim 28, further comprising a memory controller which supplies the system clock signal, the address signal and the command signal.

30. The system according to claim 28, wherein the frequency of the first clock signal is lower than the frequency of the second clock signal.

31. A system comprising:
a plurality of bus lines which respectively transfer a system clock signal, an address signal and a command signal, respectively,
a phase lock loop which receives the system clock signal and which outputs a first clock signal and a second clock signal, wherein a frequency of the first clock signal is different than a frequency of the second clock signal; and a memory module which is connected to the plurality of bus lines and which comprises (a) a register which is connected to the bus of the first clock signal, the bus of the address signal, and the bus of the command signal, and which stores the address signal and the command signal at a timing of the first clock signal, and (b) a plurality of memory chips which are each connected to the bus line of the second clock signal and which receives the address signal and command signal stored in the register at a timing of the second clock signal, wherein the address signal and the command signal are transmitted to the memory chips in two directions from a center of the memory module.

32. The system according to claim 31, further comprising a memory controller which supplies the system clock signal, the address signal and the command signal.

33. The system according to claim 31, wherein the frequency of the first clock signal is lower than the frequency of the second clock signal.

34. A system comprising:
a plurality of bus lines which respectively transfer a first clock signal, a second clock signal, an address signal and a command signal, respectively, wherein a frequency of the first clock signal is different than a frequency of the second clock signal; and
a memory module which is connected to the plurality of bus lines and which comprises (a) a register which is connected to the bus of the first clock signal, the bus of the address signal, and the bus of the command signal, and which stores the address signal and the command signal at a timing of the first clock signal, (b) a phase locked loop which is connected to the bus of the second clock signal and which outputs a plurality of internal clock signals having a same frequency as the second clock signal, and (c) a plurality of memory chips which are each connected to the phase locked loop and which receives the address signal and command signal stored in the register at a timing of a respective one of the plurality of internal clock signals, wherein the address signal and the command signal are transmitted to the memory chips in one direction of the memory module.

35. The system according to claim 34, further comprising a memory controller which supplies the first clock signal, the second clock signal, the address signal and the command signal.

36. The system according to claim 34, wherein the frequency of the first clock signal is lower than the frequency of the second clock signal.

37. A system comprising:
a plurality of bus lines which respectively transfer a first clock signal, a second clock signal, an address signal and a command signal, respectively, wherein a frequency of the first clock signal is different than a frequency of the second clock signal; and
a memory module which is connected to the plurality of bus lines and which comprises (a) a register which is connected to the bus of the first clock signal, the bus of the address signal, and the bus of the command signal, and which stores the address signal and the command signal at a timing of the first clock signal, (b) a phase locked loop which is connected to the bus of the second clock signal and which outputs a plurality of internal clock signals having a same frequency as the second clock signal, and (c) a plurality of memory chips which are each connected to the phase locked loop and which receives the address signal and command signal stored in the register at a timing of a respective one of the plurality of internal clock signals, wherein the address signal and the command signal are transmitted to the memory chips in two directions from a center of the memory module.

38. The system according to claim 37, further comprising a memory controller which supplies the first clock signal, the second clock signal, the address signal and the command signal.

39. The system according to claim 37, wherein the frequency of the first clock signal is lower than the frequency of the second clock signal.

40. A memory module comprising a plurality of semiconductor memory devices, wherein each of the semiconductor memory devices comprises (a) a clock buffer which receives an external clock signal and a control signal, and which is responsive to the control signal to output a first internal clock signal having a frequency which is lower than a frequency of the external clock signal and a second internal clock signal having a frequency which is the same as the frequency of the external clock signal, (b) a controller which outputs the control signal designating the frequency of the first internal clock signal relative to the frequency of the second internal clock signal, (c) an address buffer which receives an address signal at a timing of the first internal clock signal, (d) a command buffer which receives a command signal at a timing of the first internal clock signal, (e)

and a data buffer which inputs/outputs data at a timing of the second internal clock signal.

41. A memory module comprising a plurality of semiconductor memory devices, wherein each of the semiconductor memory device comprises (a) an address buffer which receives an address signal at a timing of a first clock signal, (b) a command buffer which receives a command signal at a timing of the first clock signal, and (c) a data buffer which inputs/outputs data at a timing of a second clock signal, wherein a frequency of the second clock signal is greater than a frequency of the first clock signal.

42. A memory module comprising:

a register which stores an address signal and a command signal at a timing of a first clock signal; and a plurality of memory chips receives the address signal and command signal stored in the register at a timing of a second clock signal, wherein a frequency of the first clock signal is different than a frequency of the second clock signal.

43. A memory module as claimed in claim 42, wherein the address signal and the command signal are transmitted to the memory chips in two directions from a center of the memory module.

44. A memory module as claimed in claim 42, wherein the address signal and the command signal are transmitted to the memory chips in one direction of the memory module.

\* \* \* \* \*